United States Patent
Kim et al.

(10) Patent No.: US 7,447,972 B2
(45) Date of Patent: Nov. 4, 2008

(54) METHODS AND APPARATUS FOR CONSTRUCTING LOW-DENSITY PARITY CHECK (LDPC) MATRIX

(75) Inventors: Hyun-jung Kim, Suwon-si (KR); Yoon-woo Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 672 days.

(21) Appl. No.: 11/081,094

(22) Filed: Mar. 16, 2005

(65) Prior Publication Data

US 2006/0031745 A1 Feb. 9, 2006

(30) Foreign Application Priority Data

Aug. 5, 2004 (KR) .................... 10-2004-0061797

(51) Int. Cl.
  *H03M 13/00* (2006.01)
(52) U.S. Cl. ................................ 714/752
(58) Field of Classification Search ............. 714/752
  See application file for complete search history.

(56) References Cited

U.S. PATENT DOCUMENTS

| | | | |
|---|---|---|---|
| 5,954,838 | A | 9/1999 | Leshem et al. |
| 6,505,319 | B1 | 1/2003 | Kodama |
| 6,567,465 | B2 | 5/2003 | Goldstein et al. |
| 6,715,121 | B1 | 3/2004 | Laurent |
| 6,757,122 | B1 * | 6/2004 | Kuznetsov et al. ............ 360/53 |
| 2002/0042899 | A1 | 4/2002 | Tzannes et al. |
| 2003/0037298 | A1 | 2/2003 | Eleftheriou et al. |
| 2003/0079172 | A1 | 4/2003 | Yamagishi et al. |
| 2004/0034828 | A1 * | 2/2004 | Hocevar ................ 714/800 |
| 2004/0186992 | A1 | 9/2004 | Matsumoto |
| 2007/0011568 | A1 * | 1/2007 | Hocevar ................ 714/758 |

FOREIGN PATENT DOCUMENTS

| | | |
|---|---|---|
| JP | 2-195457 | 8/1990 |
| JP | 5-135482 | 6/1993 |
| JP | 2000-331439 | 11/2000 |
| JP | 2003-115768 | 4/2003 |
| JP | 2003-198383 | 7/2003 |
| KR | 2004-33554 | 4/2004 |
| KR | 2004-36460 | 4/2004 |

(Continued)

OTHER PUBLICATIONS

U.S. Patent Publication No. 2003/0037298 corresponds to Japanese Patent Publication No. 2003-115768.

(Continued)

*Primary Examiner*—M. Mujtaba K Chaudry
*Assistant Examiner*—Sam Rizk
(74) *Attorney, Agent, or Firm*—Stein, McEwen & Bui, LLP

(57) ABSTRACT

Methods and apparatus for constructing a parity check matrix for use in a low-density parity check (LDPC) coding scheme are provided. The apparatus includes at least one index generator for generating row indexes of "1"s, which indicate row positions of the "1"s in each column of the parity check matrix, wherein the index generator is implemented by a modular shift register generator that generates a row index of a "1" at each clock.

23 Claims, 8 Drawing Sheets

FOREIGN PATENT DOCUMENTS

| TW | 200406666 | 5/2004 |
|---|---|---|
| TW | 200412722 | 7/2004 |
| WO | WO 02/09976 | 12/2002 |
| WO | WO 02/099976 | 12/2002 |

OTHER PUBLICATIONS

U.S. Patent Publication No. 2004/0186992 A1 corresponds to Japanese Patent Publication No. 2003-198383.

U.S. Patent No. 6,505,319 corresponds to Japanese Patent Publication No. 2000-331439.

Search Report issued Mar. 8, 2006 by European Patent Office re: European Application No. 05 25 3997 (4 pp).

MacKay, David J.C.. "Good Error-Correcting Codes Based on Very Sparse Matrices," *IEEE Transactions on Information Theory,* vol. 45, No. 2, Mar. 1999 (pp. 399-431).

Sorokine Vladislav et al. "Gallager Codes for CDMA Applications—Part I: Generalizations, Constructions and Performance Bounds," *IEEE Transactions on Communications,* vol. 48, No. 10, Oct. 2000 (pp. 1660-1668).

Vasic, Bane. "Structured Iteratively Decodable Codes Based on Steiner Systems and Their Application in Magnetic Recording," IEEE Global Telecommunications Conference, San Antonio, TX: vol. 5, Nov. 25, 2001 (pp. 2954-2960).

Xilinix Logicore. "Linear Feedback Shift Register v3.0," Product Specification, Mar. 28, 2003 (pp. 1-19). <http://www.xilinix.com/ipcenter/catalog/logicore/docs/lfsr.pdf>.

Vasic, B., "Structured Iteratively Decodable Codes Based on Steiner Systems and Their Application in Magnetic Recording", IEEE Global Telecommunications Conference, 2001, Globecom '01, vol. 5, 25-29, Nov. 2001, pp. 2954-2960.

Office Action issued in corresponding Taiwanese Patent Application No. 94117622 dated May 7, 2008.

US 2002/0042899 and WO 02/099976, cited in the Taiwanese Office Action, were previously cited in the Information Disclosure Statement filed Nov. 27, 2006.

\* cited by examiner

| CHARACTERISTIC EQUATION | $f_1(x) = x^6 + x^5 + 1$ |
|---|---|
| INITIAL VALUE | 000001 |
| OUTPUT ROW INDEXES | 0 1 3 7 15 31 31 30 29 26 21 10 21 11 22 12 25 19 6 13 27 23 14 29 27 22 13 26 20 9 18 4 9 19 7 14 28 24 17 2 5 11 23 15 30 28 25 18 5 10 20 8 17 3 6 12 24 16 1 2 4 8 16 |

| CHARACTERISTIC EQUATION | $f_1(x) = x^6 + x^5 + x^4 + x + 1$ |
|---|---|
| INITIAL VALUE | 001111 |
| OUTPUT ROW INDEXES | 28 11 22 12 11 5 25 1 2 4 8 16 0 19 21 10 7 29 9 18 4 27 5 10 20 8 3 21 25 18 23 14 15 13 9 1 17 17 2 23 29 26 7 14 28 24 3 6 12 24 16 19 6 31 13 26 20 27 22 31 30 15 30 |

US 7,447,972 B2

METHODS AND APPARATUS FOR CONSTRUCTING LOW-DENSITY PARITY CHECK (LDPC) MATRIX

CROSS-REFERENCE TO RELATED PATENT APPLICATIONS

This application claims all benefits of Korean Patent Application No. 2004-61797, filed on Aug. 5, 2004, in the Korean Intellectual Property Office, the disclosure of which is incorporated herein in its entirety by reference.

BACKGROUND OF THE INVENTION

1. Field of the Invention

The present invention relates to methods and apparatus for constructing a parity check matrix, and more particularly, to methods and apparatus for constructing a low-density parity check (LDPC) matrix, which can considerably reduce memory capacity of encoders and decoders in a low-density parity check (LDPC) coding scheme.

2. Related Art

Recently, various types of coding schemes have been proposed for communication and storage systems. One class of codes, generally referred to as low-density parity check (LDPC) codes, has been described as having good error detection and correction performance. In addition, LDPC codes can also be decoded at very high rates of speed. However, such LDPC codes are constructed by random choice of low-density parity check (LDPC) matrices, which require complex encoders and decoders with a large amount of memory.

For example, FIG. 1 shows matrices for explaining a concept of low-density parity check (LDPC) coding and decoding scheme. As shown in FIG. 1, the low-density parity check (LDPC) coding method generates parity information by using a low-density parity check matrix (H) whose elements are mostly 0's along with some "1"s.

In the parity check matrix (H), the number of "1"s in each row or column is referred to as row degree or column degree, respectively. Generally, a parity check matrix whose columns all have the same column degree and whose rows all have the same row degree is called a regular parity check matrix. A parity check matrix whose rows and columns do not all have the same row degree and column degree is called an irregular parity check matrix. In a regular parity check matrix, the row degree is referred to as row weight, Wr, and the column degree is referred to as column weight, Wc.

Parity information is generated on the basis of a low-density parity check (LDPC) coding scheme using the following Equation:

$$HX=0 \qquad (1).$$

In Equation (1), H is an m×n parity check matrix, and X is an n×1 codeword matrix. X is comprised of m message information and p parity information, so that m+p=n.

A basic concept of LDPC coding is disclosed by D. J. MacKay, "Good Error-correction Codes Based on Very Sparse Matrices", IEEE Trans. on Information Theory, vol. 45, no. 2, pp. 399-431, 1999. D. J. Mackay discloses that parity information is generated by solving Equation (1) with a matrix algebra, such as a Gaussian Elimination method.

Parity check decoding also includes a procedure for performing a parity check on the basis of Equation (1).

There are basically two different techniques of constructing a conventional parity check matrix of LDPC codes. In the first technique, row indexes, which indicate row positions of each "1" in each column of the parity check matrix H, are arbitrarily set by a user. For example, row indexes of 1, 3, and 5 may be set for the first column, row indexes of 2, 4, and 6 may be set for the second column, 7, 9, and 11 may be set for the third column, and so forth. This technique can be easily implemented, but has poor bit error rate (BER) performance. In the second technique, row indexes, which indicate row positions of "1" in each column of the parity check matrix H, are determined randomly. Implementation of the second technique is more complicated since row positions (indexes) of "1"s are randomly distributed. However, the second technique of constructing parity check matrix of LDPC codes has excellent BER performance.

An example of the second technique of constructing the parity check matrix will now be described as follows.

First, Wc row indexes of element "1"s in the first column are determined. Next, arbitrary row indexes of "1"s in the second column are determined such that none is the same as row indexes of "1"s in the first column. Then, arbitrary row indexes of "1"s for the third column are determined such that none is the same as row indexes of "1"s in the first and second columns. This procedure is repeated through to the last column.

In summary, in the second technique of constructing a parity check matrix, row indexes of "1"s in each column of the parity check matrix H are set arbitrarily as long as no two columns have the same row index.

According to the second technique of constructing the parity check matrix, previously determined row indexes of "1"s should be stored in a memory of an apparatus for constructing the parity check matrix. Also, for encoding or decoding purposes, all the row indexes of "1"s should be stored in a memory of an encoder or a decoder.

FIG. 2 shows a memory structure for storing a parity check matrix. As shown in FIG. 2, the memory can be a random-access memory (ROM) 20. The parity check matrix can be defined by row indexes of "1"s, which represent positions of "1"s in each column, and column indexes of "1"s, which represent positions of "1"s in each row. A parity check matrix H which is defined by row indexes of "1"s is stored in the memory 20 for encoding and decoding purposes.

As also shown in FIG. 2, one row index of "1" occupies one address of the memory 20. Consequently, the space occupied by one parity check matrix is n×Wc×B. Here, B is the number of bits of a row index of the "1", and $2^B$=m, where m is the number of rows of the parity check matrix.

An example of an m×n parity check matrix having satisfactory BER error correction performance is a 512×(512×17) parity check matrix. The memory space required to store the m×n parity check matrix is 512($=2^9$)×(512×7)×9 bits. Generally, achieving better BER performance requires using large amounts of memory to store the parity check matrix. However, using large amounts of memory causes several problems, such as, for example, a substantial increase in the cost of producing corresponding encoders and decoders.

SUMMARY OF THE INVENTION

An aspect of present invention advantageously provides methods and apparatus for constructing a parity check matrix by using shift registers, which can significantly reduce large amounts of memory required for low-density parity check (LDPC) coding and decoding purposes.

According to an aspect of the present invention, an apparatus is provided for constructing a low density parity check (LDPC) matrix of rows and columns, comprising: at least one index generator for generating row indexes of "1"s, which indicate row positions of the "1"s in each column of the parity check matrix, wherein the index generator is implemented by a modular shift register generator (MSRG) that generates a row index of a "1" at each clock.

According to an aspect of the present invention, the index generator comprises: s number of registers connected in series which receive an initial value of s bits, store the initial value bit-by-bit, and each shift corresponding stored bit to a next register at a clock; a feedback line through which a bit value stored in a last one of the s registers is selectively fed-back; and an adder connected between every two registers, which adds a bit value of a preceding register with the fed-back value and provides the resulting value to a succeeding register.

According to an aspect of the present invention, the row index is a vector of t bits output from "t" number of registers selected from among the "s" number of registers, the s and t satisfying the following equations:

$$m=2^t$$

$$n \leq 2^s-1,$$

where m is the number of rows and n is the number of columns of the parity check matrix.

According to an aspect of the present invention, the feedback line includes a switch with a coefficient chosen such that all the vectors output from the "s" registers during $2^s-1$ clocks are different from each other.

According to an aspect of the present invention, the coefficient of the switch is chosen from among coefficients of a primitive polynomial p(x) into which $x^v-1$ can be divided, where v is a smallest possible positive number satisfying the following equation:

$$v=p^u-1,$$

and where the primitive polynomial is an irreducible polynomial of degree of u, having coefficients being any of 0 through p−1, that is p(x) IN GF(p)[x], the p being any prime number.

According to another aspect of the present invention, a method of constructing a low-density parity check (LDPC) matrix comprises: generating at least one index of a "1", which represents a position of the "1" in each column of a parity check matrix, wherein the generation of at least one index is implemented by a modular shift register generator (MSRG) that generates a row index of the "1" at each clock.

According to an aspect of the present invention, at least one index is generated by: receiving and storing in a register an initial value of "s" bits; selectively feeding back a least significant bit of the initial value; adding the fed-back bit value to each bit of the initial value; and storing as an output vector each of "t" bits selected from among the "s" bits resulting from the addition, and outputting the t-bit output vector as a row index of the "1".

According to an aspect of the present invention, the row index of the "1" is a vector of "t" bits output from "t" number of registers arbitrarily selected from among the "s" number of registers, the "s" and "t" satisfying the following equation:

$$m=2^t$$

$$n \leq 2^s-1,$$

where "m" is the number of rows, and "n" is the number of columns of the parity check matrix.

According to an aspect of the present invention, the selectively feeding back is determined by coefficients of a characteristic polynomial of the modular shift register generator (MSRG), in which the coefficients are chosen such that all vectors output during $2^s-1$ clocks are different.

According to an aspect of the present invention, the coefficients are chosen from coefficients of a primitive polynomial p(x) into which $x^v-1$ can be divided, where "v" is a smallest possible positive number satisfying the following equation:

$$v=p^u-1,$$

and where the primitive polynomial is a irreducible polynomial of degree "u", having coefficients being any of 0 through p−1, that is p(x) IN GF(p)[x], the "p" being any prime number.

According to a still another aspect of the present invention, an apparatus for constructing a parity check matrix is provided with: a modular shift register generator which generates indexes of "1"s indicating positions of "1"s in the parity check matrix.

According to an aspect of the present invention, a feedback line of the modular shift register generator (MSRG) is specified by a primitive polynomial.

According to an aspect of the present invention, an initial value of the modular shift register generator (MSRG) is chosen such that at each clock none of generated row indexes in a column are the same.

According to a yet another aspect of the present invention, a computer-readable medium comprising instructions that, when executed by a computer system, act as a modular shift register generator (MSRG) to generate at least one index of a "1", which represents a position of the "1" in each column of a parity check matrix at each clock. Such an index is generated by instructions that include: receiving and storing in a register an initial value of s bits; selectively feeding back a least significant bit of the initial value; adding the fed-back bit value to each bit of the initial value; and storing as an output vector each of t bits selected from among the s bits resulting from the addition, and outputting the t-bit output vector as a row index of the "1".

Additional aspects and/or advantages of the invention will be set forth in part in the description which follows and, in part, will be obvious from the description, or may be learned by practice of the invention.

BRIEF DESCRIPTION OF THE DRAWINGS

A better understanding of the present invention will become apparent from the following detailed description of example embodiments and the claims when read in connection with the accompanying drawings, all forming a part of the disclosure of this invention. While the following written and illustrated disclosure focuses on disclosing example embodiments of the invention, it should be clearly understood that the same is by way of illustration and example only and that the invention is not limited thereto. The spirit and scope of the present invention are limited only by the terms of the appended claims. The following represents brief descriptions of the drawings, wherein:

FIG. 6 is a table of information regarding the first index generator shown in FIG. 5;

FIG. 8 is a table of information regarding the second index generator shown in FIG. 7.

DETAILED DESCRIPTION OF THE INVENTION

The present invention advantageously provide new efficient methods and apparatus for constructing a low-density parity check (LDPC) matrix for use in LDPC coding and decoding schemes, which can reduce significant amounts of memory required. Example embodiments of the present invention will now be described in detail with reference to the attached drawings.

Figure 3:
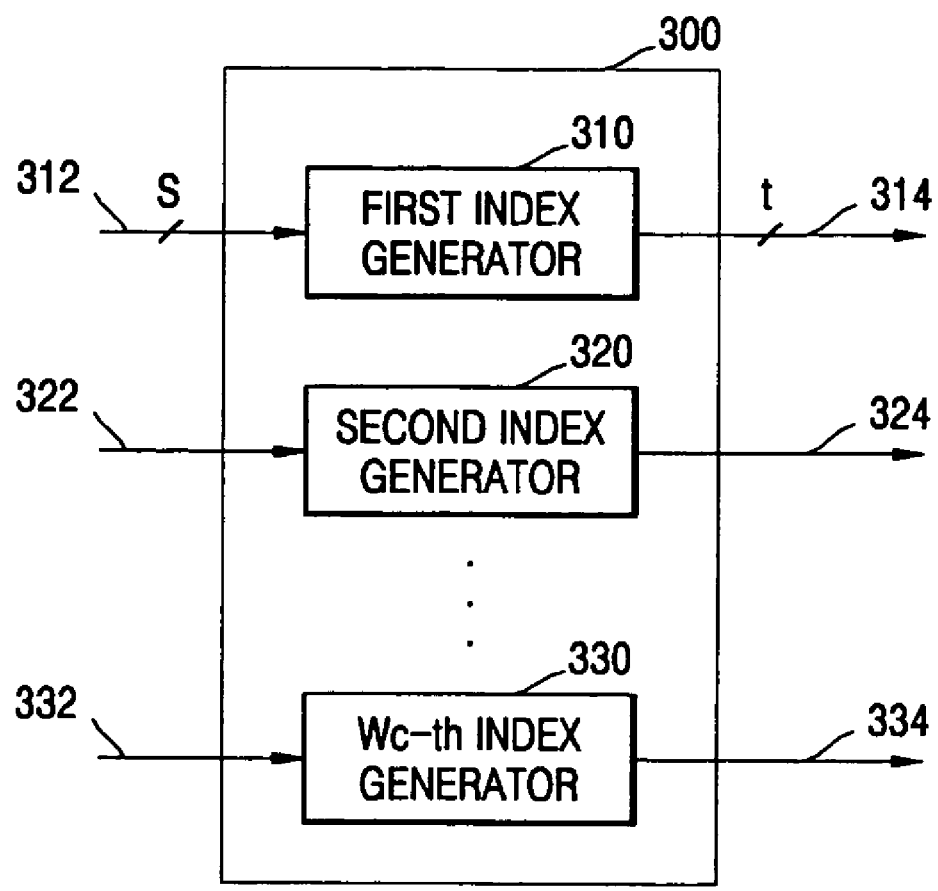
FIG. 3 is a block diagram of an apparatus for constructing a parity check matrix according to an embodiment of the present invention.

FIG. 3 is a block diagram illustrating an apparatus 300 for constructing a parity check matrix according to an embodiment of the present invention.

Referring to FIG. 3, the apparatus 300 includes a first index generator 310, a second index generator 320, . . . , and a Wc-th index generator 330. Here, Wc represents a column weight.

The first index generator 310 receives a first initial value 312 of "s" bits, and generates a row index 314 of the first "1" in "t" bits for each column of the parity check matrix. In more detail, the first index generator 310 outputs a row index (in t bits) of the first "1" for the first column at a first clock, generates a row index of the first "1" for the second column at a second clock, generates a row index of the first "1" for the third column at a third clock, and so on through to the last column.

The second through Wc-th index generators 320 through 330 function analogously to the first index generator 310.

For example, the second index generator 320 receives an s-bit second initial value 322, and generates t bits of a row index 324 of the second "1" for each column of the parity check matrix. That is, the second index generator 320 outputs a row index (in t bits) of the second "1" for the first column at the first clock, generates a row index of the second "1" for the second column at the second clock, generates a row index of the second "1" for the third column at the third clock, and so on through to the last column.

The Wc-th index generator 330 receives an s-bit Wc-th initial value 332, and generates t bits of a row index 334 of the Wc-th "1" for each column of the parity check matrix. That is, the Wc-th index generator 330 outputs a row index (in t bits) of the Wc-th "1" for the first column at the first clock, generates a row index of the Wc-th "1" for the second column at the second clock, generates a row index of the Wc-th "1" for the third column at the third clock, and so on through to the last column.

Consequently, Wc row indexes indicating positions of "1"s in the first column are output at the first clock, Wc row indexes indicating positions of "1"s in the second column are output at the second clock, Wc row indexes indicating positions of "1" in the third column are output at the second clock, and so on through to the last column.

Figure 1:
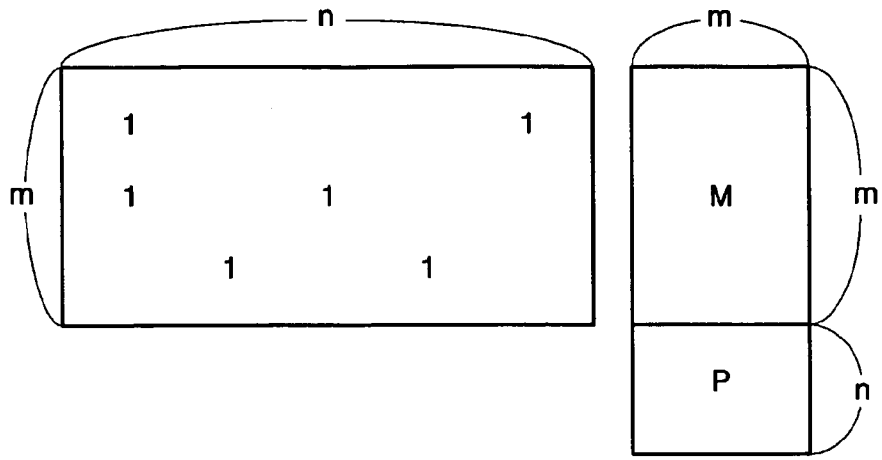
FIG. 1 shows matrices for explaining a concept of low-density parity check (LDPC) coding and decoding scheme useful in gaining a more thorough appreciation of the present invention.
Figure 2:
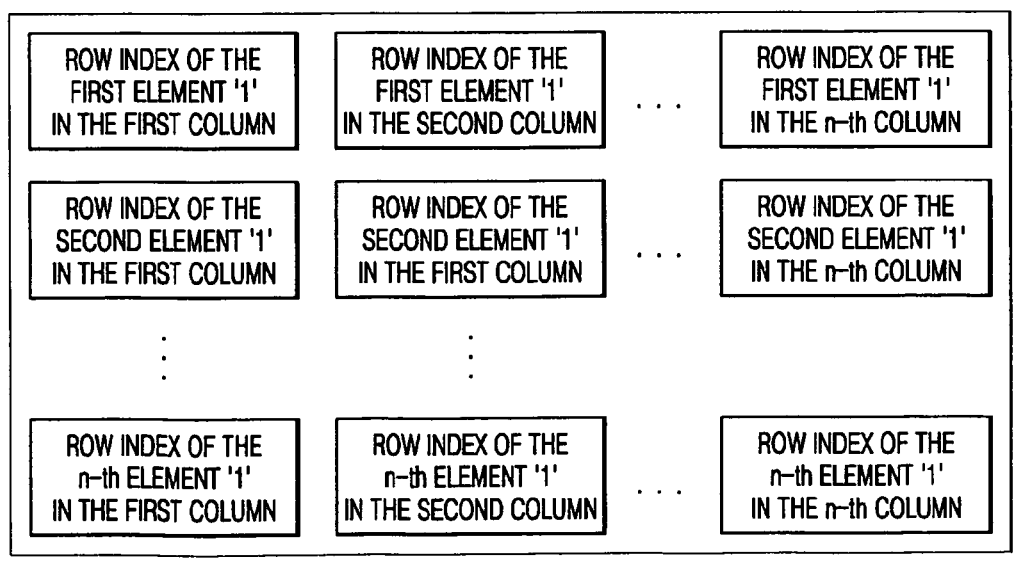
FIG. 2 shows a memory structure for storing a parity check matrix.

In the apparatus 300 for constructing a parity check matrix, instead of the memory shown in FIG. 2 which stores the parity check matrix H of Equation (1), an encoder or decoder provides the parity check matrix H.

The first initial value 312, the second initial value 322, . . . , and the Wc-th initial value 332 are each input to the first through Wc-th index generators 310, 320, and 330, respectively. The initial values are determined by a user such that identical values among the first through the Wc-th row indexes 314 to 334 are not generated at the same clock.

Figure 4:
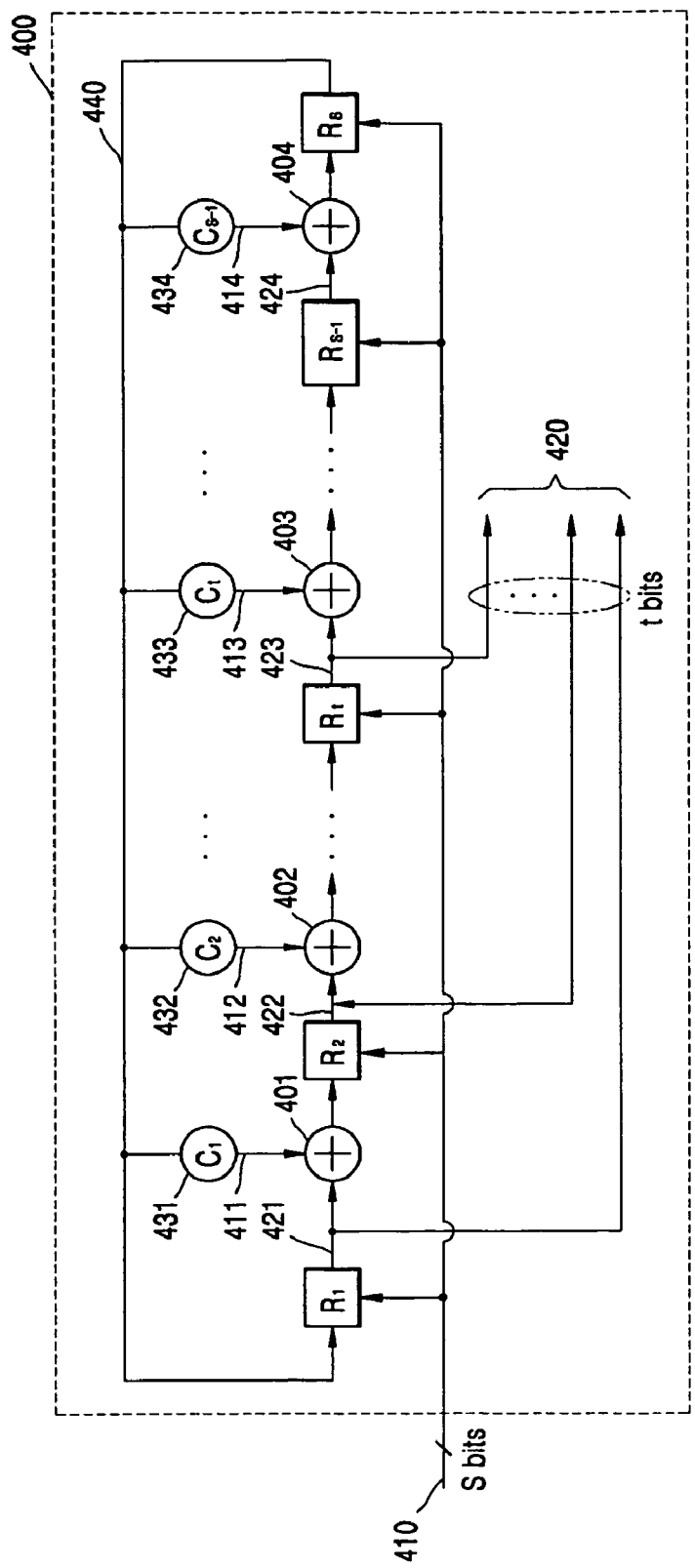
FIG. 4 is a detailed block diagram of an index generator shown in FIG. 3.

FIG. 4 is a detailed block diagram of an index generator used in the apparatus 300 shown in FIG. 3.

Since the first through Wc-th index generators 310 through 330 of the apparatus 300 all have the same configuration, and the only differences are their different coefficients C1, C2, . . . Cs−1 and different initial values 312 through 332, each of the index generators 310 through 330 can be considered equivalent to an index generator 400 shown in FIG. 4, with an initial value 410 and a row index 420.

The index generator 400 includes s number of registers R1, R2, . . . , Rs, s−1 number of switches 431, 432, . . . , 434, and s−1 number of adders 401, 402, . . . , 404. The combination of the registers, the adders and the switches is referred to as a modular shift register generator (MSRG).

At the first clock, the initial value 410 is input to registers R1, R2, . . . , Rs. A row index 420 corresponds to a value stored in registers R1, R2, . . . , $R_t$ at each clock. At the first clock, the initial value stored in registers R1, R2, . . . , $R_t$ is output as is. The t number of registers R1, R2, . . . , $R_t$ that output the row index is arbitrarily chosen from among the registers R1, R2, Rs.

Outputs of the registers R1, R2, . . . , Rt correspond to row indexes of the "1"s of the parity check matrix H. For example, if t=3, s=4, the initial value 410 is "1101b", and registers for outputting the row index 420 are chosen to be R1, R2, and R3, the row index 420 can be "110" in binary, i.e., "6" in decimal, at the first clock. Thus, the row index of the first "1" for the first column of the parity check matrix is "6", so the 7th element of the first column of the parity check matrix becomes "1" (if the row index of the first "1" is "000b" ("1" in decimal), the first element of the first column becomes "1", if the row index is "001b" ("2" in decimal), the second row of the first column becomes "1", if the row index is "010b" ("3" in decimal), the third row of the first column becomes "1", and so forth).

At the second clock, values 421, 422, . . . , and 424 stored in registers, R1, R2 . . . Rs, are added to outputs 411, 412, . . . , 414 of switches 431, 432, . . . , 434, by adders 401, 402, . . . , 404, and the results are stored respectively in registers, R1, R2 . . . or Rs, next to the adders 401, 402, 403 or 404. Here, each value is "0b", or "1b". The outputs 411, 412, . . . , 414 result from switching an output of the final register Rs fed back through a feedback line 440 at switches 431, 432, . . . 434, respectively. Coefficients C1, C2, . . . , Cs−1 are values that indicate whether to switch the fed-back output, each of which is "0" or "1". At the second clock, values newly stored in registers, R1, R2 . . . Rs, are output as a second row index 420.

The above procedure is repeated until the n-th clock, and a row index of t bits is output at each clock.

The number "m" of rows and the number "n" of columns of the parity check matrix, the number "s" of registers, and the number "t" of registers for outputting the row index are related by the following Equation:

$$m = 2^t$$

$$n \leq 2^s - 1 \qquad (2)$$

As shown in the above Equations (2), the number m of rows of the parity check matrix is equal to the range $2^t$ of possible indexes of "1"s, and the number n of columns of the parity check matrix is equal to or less than the minimum number of clocks $2^s-1$.

Coefficients C1, C2, . . . , Cs−1 can be represented by a characteristic equation, such as the following Equation:

$$f(x) = x^s + C_{s-1}x^{s-1} + C_{s-2}x^{s-2} + \ldots + C_1x + C_0 \quad (3)$$

The above Equation (3) is the characteristic equation for the index generator 400, where Co=1, and Ci=0 or 1. The characteristic equation specifies a coupling structure of the feedback line 440 of the modular shift register generator (MSRG).

In an example embodiment of the present invention, the characteristic equation for the index generator 400 is a primitive polynomial with coefficients C1, C2, . . . , Cs−1 of uniform degree.

The primitive polynomial is an irreducible polynomial p(x) of degree u, into which $x^v-1$ can be divided, where v is a smallest possible positive number satisfying the following Equation:

$$v = p^u - 1 \quad (4)$$

Here, in the above Equation (4), the polynomial p(x) is an irreducible polynomial with coefficients ranging from 0 to p−1, namely, p(x) in GF(p)[x], where p is any prime number. (An irreducible polynomial is a polynomial that cannot be factorized.)

If the characteristic equation of degree "s", which indicates the coupling structure of the feedback line 440 of the index generator 400, is the primitive polynomial, that is, if the coefficients C1, C2, . . . , Cx−1 are chosen to be coefficients of the primitive polynomial, vectors 420 output from s registers R1, R2, . . . , Rs are all different during $2^s-1$ clocks. In other words, each of the vectors that can be represented by "s" registers is output once.

A more detailed description of the primitive polynomial for use in a MSRG structure is disclosed in "Shift Register Sequence, Holden-Day, San Francisco, 1967" by S. W. Golomb, and, as a result, needs not be described herein.

As shown in FIG. 4, if outputs from "t" of "s" registers are chosen to be the output vector 420, all possible vector values are output with a similar frequency. In particular, in the case of $n=2^s-1$, all vectors except a zero vector are output as many as $2^s-1$ times. The zero vector is output $2^{s-1}-1$ times.

Therefore, the parity check matrix H constructed by the index generator 400 as shown in FIG. 4, has almost-regular low-density parity check (LDPC) codes. Generally, the decoding performance, namely the BER performance, becomes lower as the maximum row degree becomes larger. However, in the example embodiment of the present invention, as described above, since the probability that "1" appears in each position of the parity check matrix is almost regular, the decoding performance can be improved significantly.

Meanwhile, the initial value 410 should be chosen such that different index generators do not output the same vector 420 at the same clock. Otherwise, if different index generators generate the same output at the same clock, positions of "1"s in a column are redundant, resulting in an irregular parity check matrix. The initial value 410 can be determined through a simulation.

Figure 5:
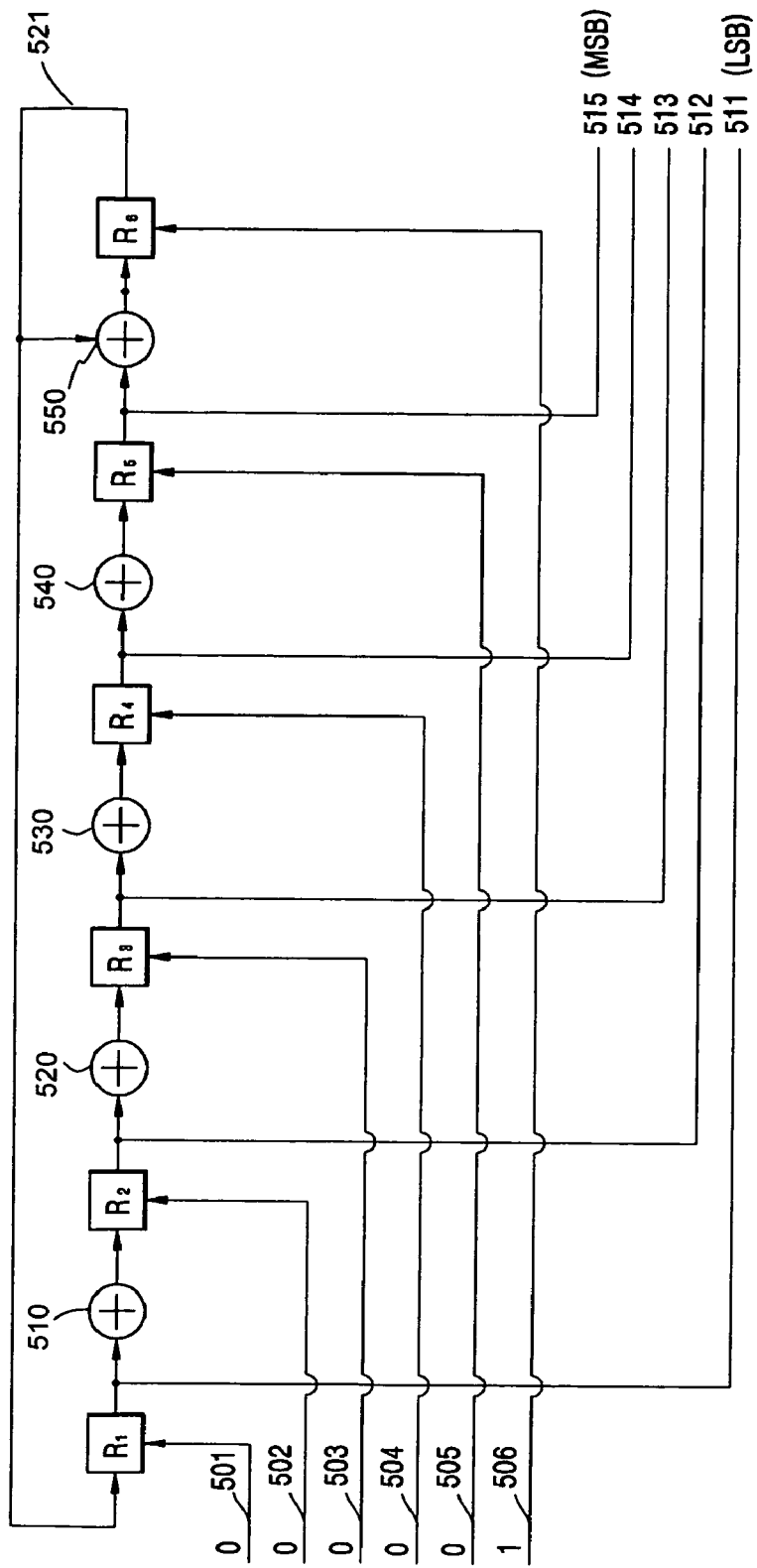
FIG. 5 is a block diagram of a first index generator according to an embodiment of the present invention.

FIG. 5 is a block diagram of the first index generator 310 shown in FIG. 3, according to an embodiment of the present invention.

Referring to FIG. 5, s=6, t=5, the characteristic equation 3 of the first index generator 310 is chosen to be $f_1(x)=x^6+x^5+1$ from a 6-degree primitive polynomial, and the initial value is chosen as "000001b". Accordingly, C5=1, C4=C3=C2=C1=0, and C0=1, and initial values of registers R1, R2, R3, R4, R5 are all "0b" and R6 is "1b".

When "s" is set as "6", the first index generator 310, as shown in FIG. 5 comprises six registers R1, R2 . . . R6 connected in series with each coupled to receive a corresponding initial value 501, 502 . . . 506; and five adders 510, 520, 530, 540 and 550 each connected between every two registers to add an output value from the corresponding registers R1, R2 . . . R6, which are known as a row index.

At the first clock, since values 511 to 515 are output from the registers R1 through R5, as a row index, the row index 511 through 515 corresponds to the initial values 501 to 505. Thus, the row index 511 through 515 at the first clock is comprised of 0, 0, 0, 0, 1, which is called a row index vector "00001b".

At the second clock, a value of the register R2 corresponds to the value of the register R1 at the first clock; a value of the register R3 corresponds to the value of the register R2 at the first clock; a value of the register R4 corresponds to the value of the register R3 at the first clock; and a value of the register R5 corresponds to the value of the register R4 at the first clock. A value of the register R6 at the second clock is determined by adding the value of the register R6 with the value of the register R5 at the first clock, since the previous value of the register R6 is fed back to an adder 550 through a feedback line 521 to be added with the (previous) value of the register R5. A value of the register R1 at the second clock is determined to be the value of the register R6 at the first clock, since the value is fed back to the register R1 through a feedback line 521.

As a result, values of the registers R1 through R5 are each 1, 0, 0, 0, 0 at the second clock, resulting in the row vector "10000b", which is "1" in decimal (by the definition that the value of the register R1 is the least significant bit).

Row indexes at the third to n-th clocks are generated in the same way as described above.

FIG. 6 illustrates a table of information 600 regarding the first index generator shown in FIG. 5.

Referring to FIG. 5, as described above, the characteristic equation is chosen to be $f_1(x)=x^6+x^5+1$ from a 6-degree primitive polynomial, and the initial value is chosen as "000001b". The number of row indexes output by the first index generator 310 is $2^s-1=2^6-1=63$, among which the number 0 is output $2^{s-t}-1=2^{6-5}-1=1$ time and the other numbers 1 to 31 are each output $2^{s-t}=2^{6-5}=2$ times.

Figure 7:
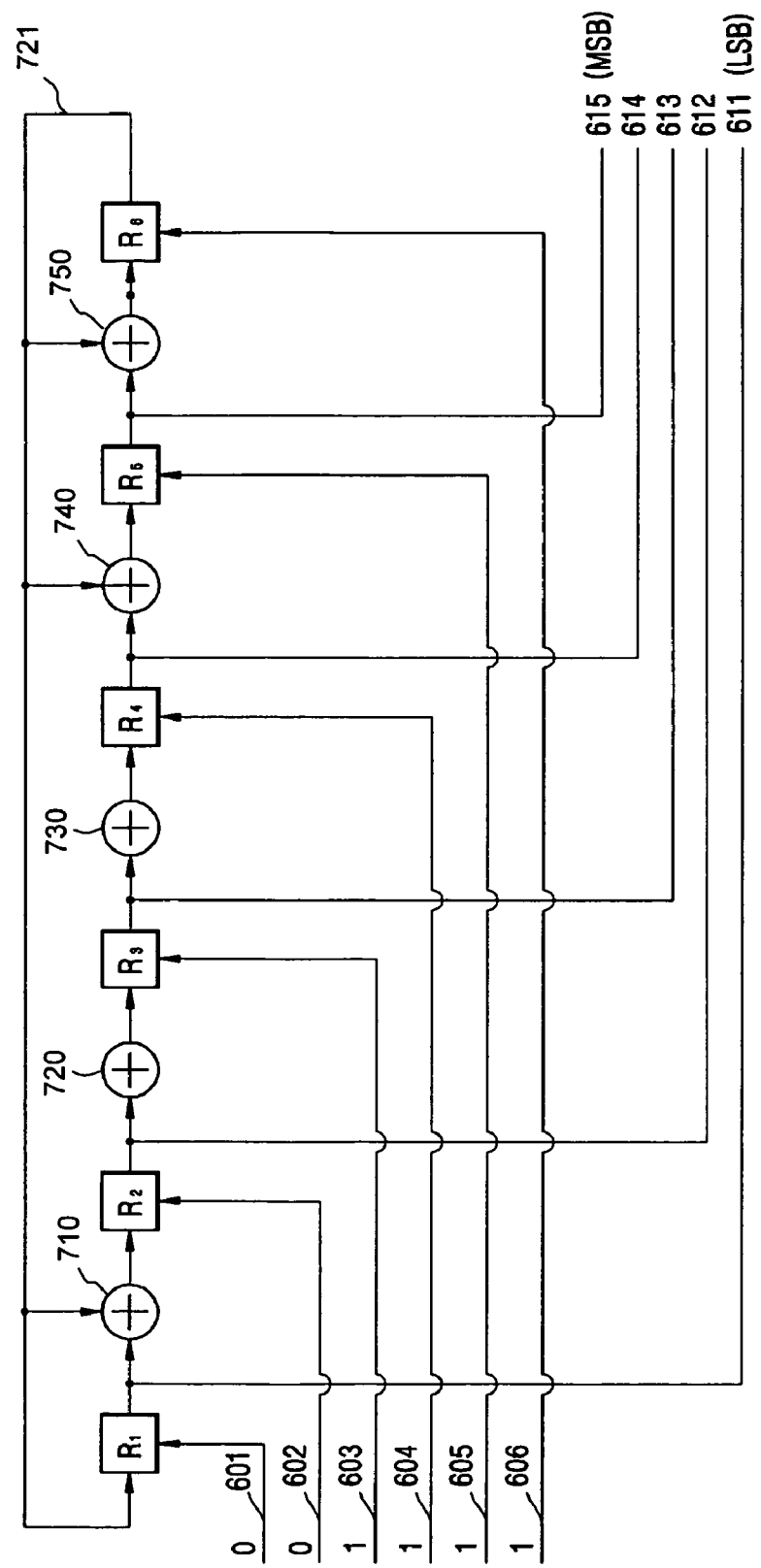
FIG. 7 is a block diagram of a second index generator according to an embodiment of the present invention.

FIG. 7 is a block diagram of the second index generator 320, shown in FIG. 3, according to an embodiment of the present invention.

In the second index generator 320, a feedback line is different from that of the first index generator 310, shown in FIG. 5, but operations are the same. For example, like the first index generator 310, as shown in FIG. 5, the second index generator 320 also comprises six registers R1, R2 . . . R6 connected in series with each coupled to receive a corresponding initial value 701, 702 . . . 706; and five adders 710, 720, 730, 740 and 750 each connected between every two registers to add an output value from the corresponding registers R1, R2 . . . R6, which are known as a row index.

The characteristic equation of the second index generator 320 can be arbitrarily chosen from a primitive polynomial that satisfies Equations (3) and (4), regardless of the characteristic equation of the first index generator 310. However, an initial value 701 through 706 of the second index generator 320 should be chosen such that row index vectors 511 through 515 output by the first index generator 310, and row index vectors 711 through 715 output by the second index generator 600, are not the same at the same clock.

Similarly, initial values of the third, fourth, . . . , Wc-th index generators are chosen such that row indexes output by corresponding row index generators are not the same at the same clock.

The initial values can be determined empirically through simulation. Since the row weight Wc is a very small number, for typical LDPC codes, performing a simulation to determine initial values satisfying the above conditions is not difficult.

FIG. 8 illustrates a table of information 800 regarding the second index generator shown in FIG. 7.

Referring to FIG. 8, the characteristic equation is chosen to be $f_1(x)=x^6+x^5+x^4+x+1$ from a 6-degree primitive polynomial, and the initial value of the second index generator 320 is chosen to be "001111b", by which none of 63 row indexes output by the second index generator 320 are the same as the row index output by the first index generator 310 at the same clock, as shown in FIG. 6. Likewise, the initial value of each index generator 310, 320 or 330 should be chosen such that index vectors output from all the index generators are different from each other at the same clock.

The memory space (in bits) required when storing the parity check matrix in memory as previously known in the art will now be compared between in the case of storing the parity check matrix in a memory and in the case of constructing the parity check matrix using the apparatus according to example embodiments of the present invention. Here, a parity check matrix having $m=2^9=512$, $n=2^9 \times 17=512 \times 17=8704$, and Wc=3 is taken as an example.

In the case of storing the parity check matrix in a memory, 9 bits are needed to store a row index of a "1", and thus 9×3×8704=235008 bits are needed to store the parity check matrix.

Meanwhile, according to the present invention, "t" and the minimum "s" (s_min) that satisfy Equation (2) for m=512 and n=8704, are 9 and 14, respectively, which means that an index generator requires 14 bits. Therefore, compared to the case of storing the parity check matrix, a much smaller number of only 14×Wc=14×3=42 bits is all the memory space required for constructing a parity check matrix.

In addition, if the characteristic equation of a modular shift register generator (MSRG) as shown in FIG. 4 is chosen to be a primitive equation, the number of Wr of a resulting parity check matrix is more regular, which makes decoding easier.

Figure 9:
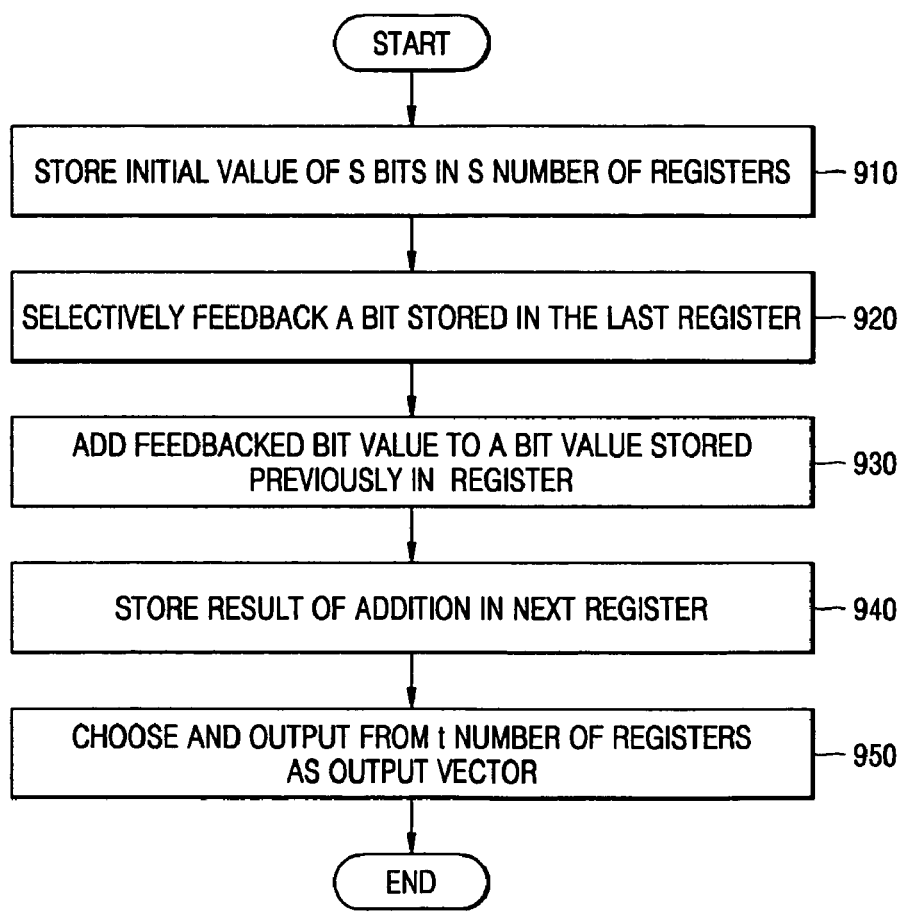
FIG. 9 is a flowchart of a method of constructing a parity check matrix according to an embodiment of the present invention.

FIG. 9 is a flowchart of methods of constructing a parity check matrix according to an embodiment of the present invention.

In operation 910, s-bit initial value is input and stored bit-by-bit in s registers of a modular shift register generator (MSRG).

In operation 920, of all the bits stored in the s registers, a bit in the last register, a least significant bit (LSB), is fed-back to be selectively provided to adders connected between the registers. Whether the LSB is fed back is determined by coefficients of a characteristic equation of the modular shift register generator (MSRG), the characteristic equation which is preferably a primitive polynomial.

In operation 930, in each adder, a bit value stored in a corresponding register before the adder is added with the fed-back value.

In operation 940, all the bits resulting from the addition are stored in corresponding registers next to the adders.

In operation 950, values of t out of s registers are output as a row index of a "1".

Operations 920 through 940 are performed during one clock cycle. Therefore, at every clock, every row index of a "1" is output.

As described in the foregoing, the present invention advantageously provides methods and apparatus for constructing a parity check matrix by using shift registers, which can significantly reduce large amounts of memory required for encoding and decoding purposes. Such methods and apparatus for constructing a parity check matrix according to example embodiments of the present invention can also be implemented as a computer program. Codes and code segments constituting the computer program may readily be inferred by those skilled in the art. The computer programs may be recorded on computer-readable media and read and executed by computers. Such computer-readable media include all kinds of storage devices, such as ROM, RAM, CD-ROM, magnetic tape, floppy discs, optical data storage devices, etc. The computer-readable media may be distributed to computer systems connected to a network, and codes on the distributed computer-readable media may be stored and executed in a decentralized fashion.

While there have been illustrated and described what are considered to be example embodiments of the present invention, it will be understood by those skilled in the art and as technology develops that various changes and modification may be made, and equivalents may be substituted for elements thereof without departing from the spirit and scope of the present invention. Many modifications may be made to adapt the teachings of the present invention to a particular situation without departing from the scope thereof. Accordingly, it is intended, therefore, that the present invention not be limited to the various example embodiments disclosed, but that the present invention includes all embodiments falling within the scope of the appended claims.

What is claimed is:

1. An apparatus for constructing a low density parity check matrix, comprising:
at least one index generator for generating row indexes of "1"s, which indicate row positions of the "1"s in each column of the parity check matrix,
wherein the index generator is implemented by a modular shift register generator to generate a row index of a "1" at each clock, and
wherein the index generator comprises:
"s" number of registers connected in series to receive an initial value of "s" bits, store the initial value bit-by-bit, and each shift corresponding stored bit to a succeeding register at a clock;
a feedback line through which a bit value stored in a last one of the registers is selectively fed-back; and
an adder connected between every two registers, to add a bit value of a preceding register with a fed-back value and provide a resulting value to the succeeding register.

2. The apparatus as claimed in claim 1, wherein the feedback line includes a switch with a coefficient chosen such that all the vectors output from the registers during $2^s-1$ clocks are different from each other.

3. The apparatus as claimed in claim 2, wherein the coefficient of the switch is chosen from among coefficients of a primitive polynomial p(x) into which $x^v-1$ can be divided, where v is a smallest possible positive number satisfying the following equation:

$$v=p^u-1,$$

and where the primitive polynomial is an irreducible polynomial of degree of u, having coefficients being any of 0 through p−1, that is p(x) IN GF(p)[x], the p being any prime number.

4. The apparatus as claimed in claim 1, wherein the row index is a vector of t bits output from t number of registers selected from among the s number registers, the s and t satisfying the following equations:

$$m=2^t$$

$$n \leq 2^s-1,$$

where m is the number of rows and n is the number of columns of the parity check matrix.

5. A method of constructing a low-density parity check matrix, comprising:
generating at least one index of a "1", which represents a position of the "1" in each column of a parity check matrix,
wherein the at least one index is generated by a modular shift register generator that generates a row index of the "1" at each clock, by:
receiving and storing in a register an initial value of s bits;
selectively feeding back a least significant bit of the initial value;
adding a fed-back bit value to each bit of the initial value; and
storing as an output vector each of t bits selected from among the s bits resulting from the addition, and outputting the t-bit output vector as a row index of the "1".

6. The method as claimed in claim 5, wherein the selectively feeding back is determined by coefficients of a characteristic polynomial of the modular shift register generator, the coefficients being chosen such that all vectors output during $2^s-1$ clocks are different.

7. The method as claimed in claim 6, wherein the coefficients are chosen from coefficients of a primitive polynomial p(x) into which $x^v-1$ can be divided, where v is a smallest possible positive number satisfying the following equation:

$$v=p^u-1,$$

and where the primitive polynomial is a irreducible polynomial of degree u, having coefficients being any of 0 through p−1, that is p(x) IN GF(p)[x], the p being any prime number.

8. The method as claimed in claim 5, wherein the row index of the "1" is a vector of t bits output from t number of registers arbitrarily selected from among the s number of registers, the s and t satisfying the following equation:

$$m=2^t$$

$$n \leq 2^s-1,$$

where m is the number of rows and n is the number of columns of the parity check matrix.

9. An apparatus for constructing a parity check matrix, comprising:
a modular shift register generator to generate indexes of "1"s indicating positions of "1"s in the parity check matrix,
wherein the modular shift register generator comprises:
"s" number of registers connected in series to receive an initial value of "s" bits, store the initial value bit-by-bit, and each shift corresponding stored bit to a succeeding register at a clock;
a feedback line through which a bit value stored in a last one of the registers is selectively fed-back; and
an adder connected between every two registers, to add a bit value of a preceding register with a fed-back value and provide a resulting value to the succeeding register.

10. The apparatus as claimed in claim 9, wherein a feedback line of the modular shift register generator is specified by a primitive polynomial.

11. The apparatus as claimed in claim 9, wherein an initial value of the modular shift register generator is chosen such that at each clock none of generated row indexes in a column are the same.

12. A computer-readable medium comprising instructions that, when executed by a computer system, act as a modular shift register generator (MSRG) to generate at least one index of a "1", which represents a position of the "1", in each column of a parity check matrix at each clock, wherein the index is generated by:
receiving and storing in a register an initial value of s bits;
selectively feeding back a least significant bit of the initial value;
adding a fed-back bit value to each bit of the initial value; and
storing as an output vector each of t bits selected from among the s bits resulting from the addition, and outputting the t-bit output vector as a row index of the "1".

13. An apparatus for constructing a low-density parity check (LDPC) matrix of M rows and N columns of message and parity information for use in a LDPC coding scheme, comprising:
a first index generator coupled to receive a first initial value, for generating a row index of the first element "1" in predetermined bits for each column, from $1^{st}$ to N columns of the parity check matrix, at a different clock;
a second index generator coupled to receive a second initial value, for generating a row index of the second element "1" in predetermined bits for each column, from $1^{st}$ to N columns of the parity check matrix, at the different clock; and
a N-th index generator coupled to receive a N-th initial value, for generating a row index of the N-th element "1" in predetermined bits for each column, from $1^{st}$ to N columns of the parity check matrix, at the different clock.

14. The apparatus as claimed in claim 13, wherein the first, second and Nth index generators, each is implemented by a modular shift register generator (MSRG) comprising:
"s" number of registers arranged in series to receive an initial value of "s" bits, to store the initial value bit-by-bit, and to shift a corresponding stored bit value to a succeeding register at a clock;
a feedback line through which a bit value stored in a last register arranged in series, is selectively fed-back;
s−1 number of adders, each disposed between every two registers, to add the stored bit value of a preceding register with the bit value fed-back, via the feedback line, and to provide a result value to a succeeding register; and
s−1 number of switches, each disposed on the feedback line to a respective adder, to control transmission of the bit value fed-back, via the feedback line, to the respective adder, wherein outputs of "t" number of registers selected from among "s" number of registers correspond to row indexes of the "1"s of the parity check matrix.

15. The apparatus as claimed in claim 14, wherein each row vector of t bits output from "t" number of registers selected from among the s number registers, the s and t satisfying the following equations:

$$m=2^t$$

$$n \leq 2^s-1,$$

where M is the number of rows and N is the number of columns of the parity check matrix.

16. The apparatus as claimed in claim 14, wherein each switch disposed on the feedback line is provided with a coefficient chosen such that all the vectors output from the registers during $2^s-1$ clocks are different from each other.

17. The apparatus as claimed in claim 16, wherein the coefficient of the corresponding switch is chosen from among coefficients of a primitive polynomial p(x) into which $x^v-1$ can be divided, where v is a smallest possible positive number satisfying the following equation:

$$v=p^u-1,$$

and where the primitive polynomial is an irreducible polynomial of degree of u, having coefficients being any of 0 through p−1, that is p(x) IN GF(p)[x], the p being any prime number.

18. The apparatus as claimed in claim 13, wherein the first index generator comprises:
   $1^{st}$ to $6^{th}$ registers arranged in series, each to receive an initial value, to store the initial value bit-by-bit, and to shift a corresponding stored bit value to a succeeding register at a clock;
   a feedback line through which a bit value stored in the $6^{th}$ register arranged in series, is selectively fed-back; and
   an adder disposed between the $5^{th}$ and $6^{th}$ registers, to add the stored bit value of the $5^{th}$ register with the bit value fed-back, via the feedback line, and to provide a result value to the $6^{th}$ register;
   wherein outputs of the $1^{st}$ to $5^{th}$ registers correspond to row indexes of the "1"s of the parity check matrix.

19. The apparatus as claimed in claim 13, wherein the first index generator comprises:
   $1^{st}$ to $6^{th}$ registers arranged in series, each to receive an initial value, to store the initial value bit-by-bit, and to shift a corresponding stored bit value to a succeeding register at a clock;
   a feedback line through which a bit value stored in the $6^{th}$ register arranged in series, is selectively fed-back;
   a first adder disposed between the $5^{th}$ and $6^{th}$ registers, to add the stored bit value of the $5^{th}$ register with the bit value fed-back, via the feedback line, and to provide a result value to the $6^{th}$ register;
   a second adder disposed between the $4^{th}$ and $5^{th}$ registers, to add the stored bit value of the $4^{th}$ register with the bit value fed-back, via the feedback line, and to provide a result value to the $5^{th}$ register; and
   a third adder disposed between the $1^{st}$ and $2^{nd}$ registers, to add the stored bit value of the $1^{st}$ register with the bit value fed-back, via the feedback line, and to provide a result value to the $2^{nd}$ register;
   wherein outputs of the $1^{st}$ to $5^{th}$ registers correspond to row indexes of the "1"s of the parity check matrix.

20. A method for constructing a low-density parity check (LDPC) matrix of M rows and N columns of message and parity information for use in an LDPC coding scheme, comprising:
   obtaining a modular shift register generator (MSRG) comprising "s" number of registers connected in series, and "s−1" adders each disposed between every two registers;
   storing, at the "s" number of registers arranged in series, an initial value of "s" bits, and shifting a corresponding stored bit value to a succeeding register at a clock;
   selectively feeding back a bit value stored in a last register, via a feedback line;
   adding, at the s−1 number of adders each disposed between every two registers, the stored bit value of a preceding register with the bit value fed-back, via the feedback line, and producing a result value to a succeeding register; and
   outputting, from "t" number of registers selected from among "s" number of registers, row indexes of the "1"s of the parity check matrix.

21. The method as claimed in claim 20, wherein each row vector of t bits output from "t" number of registers selected from among the s number registers, the s and t satisfying the following equations:

$$m=2^t$$

$$n \leq 2^s-1,$$

where M is the number of rows and N is the number of columns of the parity check matrix.

22. The method as claimed in claim 21, wherein the feedback line is provided with a switch having a coefficient chosen such that all the vectors output from the registers during $2^s-1$ clocks are different from each other.

23. The method as claimed in claim 22, wherein the coefficient of the corresponding switch is chosen from among coefficients of a primitive polynomial p(x) into which $x^v-1$ can be divided, where v is a smallest possible positive number satisfying the following equation:

$$v=p^u-1,$$

and where the primitive polynomial loan irreducible polynomial of degree of u, having coefficients being any of 0 through p−1, that is p(x) IN GF(p)[x], the p being any prime number.

* * * * *